(12) United States Patent
Lee et al.

(10) Patent No.: US 8,321,765 B2
(45) Date of Patent: Nov. 27, 2012

(54) METHOD OF READING DATA IN NON-VOLATILE MEMORY DEVICE

(75) Inventors: Jin-Wook Lee, Seoul (KR); Sang-Won Hwang, Suwon-Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 485 days.

(21) Appl. No.: 12/702,481

(22) Filed: Feb. 9, 2010

(65) Prior Publication Data

US 2010/0211852 A1    Aug. 19, 2010

(30) Foreign Application Priority Data

Feb. 17, 2009    (KR) .................. 10-2009-0012811

(51) Int. Cl.
  *G11C 29/00*    (2006.01)
(52) U.S. Cl. ........ 714/773; 714/777; 714/784; 714/763; 365/185.03; 365/185.09; 365/185.18
(58) Field of Classification Search ............. 365/185.03, 365/185.09, 185.18; 714/773, 777, 784, 714/763
See application file for complete search history.

(56) References Cited

U.S. PATENT DOCUMENTS

| | | | | |
|---|---|---|---|---|
| 6,483,745 | B2 * | 11/2002 | Saeki | 365/185.04 |
| 7,006,318 | B2 * | 2/2006 | Stence et al. | 360/69 |
| 7,050,344 | B1 * | 5/2006 | Cho et al. | 365/201 |

FOREIGN PATENT DOCUMENTS

| | | |
|---|---|---|
| KR | 100697792 B1 | 3/2007 |
| KR | 100837282 B1 | 6/2008 |
| KR | 1020080059461 A | 6/2008 |

* cited by examiner

*Primary Examiner* — Guy Lamarre
(74) *Attorney, Agent, or Firm* — Volentine & Whitt, PLLC

(57) ABSTRACT

In a method of reading data from a non-volatile memory device, read data is generated based on a word line voltage. The read data includes data read from a plurality of sectors included in the non-volatile memory device. Bad sector data is transferred data based on read data and bad sector information. The bad sector data corresponds to data read from at least one bad sector included in the plurality of sectors. The bad sector information is updated by checking error bits of the bad sector data. The word line voltage is generated based on the updated bad sector information.

20 Claims, 5 Drawing Sheets

FIG. 4

DESIRED BLOCK

| SECTOR1 | SECTOR2 | SECTOR3 | SECTOR4 | SECTOR5 |

<1ST READ CYCLE>

| | SECTOR1 | SECTOR2 | SECTOR3 | SECTOR4 | SECTOR5 |
|---|---|---|---|---|---|
| RDT | SD1 | SD2 | SD3 | SD4 | SD5 |
| BSDT | SD1 | SD2 | SD3 | SD4 | SD5 |
| BSI | NORMAL | BAD | BAD | NORMAL | BAD |
| NSDT | SD1 | | | SD4 | |

BSDRQ   ENABLE

<2ND READ CYCLE>

| | SECTOR1 | SECTOR2 | SECTOR3 | SECTOR4 | SECTOR5 |
|---|---|---|---|---|---|
| RDT | SD1' | SD2' | SD3' | SD4' | SD5' |
| BSDT | | SD2' | SD3' | | SD5' |
| BSI | | NORMAL | BAD | | NORMAL |
| NSDT | | SD2' | | | SD5' |

BSDRQ   ENABLE

<3RD READ CYCLE>

| | SECTOR1 | SECTOR2 | SECTOR3 | SECTOR4 | SECTOR5 |
|---|---|---|---|---|---|
| RDT | SD1" | SD2" | SD3" | SD4" | SD5" |
| BSDT | | | SD3" | | |
| BSI | | | NORMAL | | |
| NSDT | | | SD3" | | |

BSDRQ   DISABLE

METHOD OF READING DATA IN NON-VOLATILE MEMORY DEVICE

CROSS-REFERENCE TO RELATED APPLICATIONS

This application claims priority under 35 USC §119 to Korean Patent Application No. 10-2009-0012811 filed on Feb. 17, 2009, the subject matter of which is hereby incorporated by reference.

BACKGROUND

The inventive concept relates to non-volatile memory devices and more particularly to methods of reading data from non-volatile memory devices.

Semiconductor memory devices may be classified into volatile and non-volatile memory devices according to whether stored data is retained in the absence of applied power. Non-volatile memory devices such as flash memory devices perform write (program) and erase operations with respect to each block or sector composing the block. As the write and erase operations are repeatedly performed, the threshold voltage distribution of memory cells may broaden or shift. Therefore, read voltages used to read data from such non-volatile memory devices must be precisely controlled during a read operation. Unfortunately, precise control over the definition read voltages takes additional time, thereby undesirably extending the duration of read operations.

SUMMARY

Embodiments of the inventive concept provide methods of reading data from non-volatile memory devices that are characterized by reduced execution time.

In some example embodiments, read data including data read from a plurality of sectors is detected based on a word line voltage. Bad sector data is transferred to the error correction unit based on the read data and bad sector information. The bad sector data corresponds to data read from at least one bad sector included in the plurality of sectors. The bad sector information is updated by checking error bits of the bad sector data. The word line voltage is generated based on the updated bad sector information.

In updating the bad sector information, when the bad sector includes error bits of a number less than or equal to a predetermined number of error bits, the bad sector may be determined as a normal sector. The data read from the normal sector may be stored in a storage device as normal sector data. The normal sector data may be stored with respect to each read cycle, and the normal sector data may be corrected by an error correcting code to generate error corrected data. For example, the error bits included in the normal sector data is corrected when all of the plurality of the sectors are determined as the normal sector. The error correcting code may include Hamming code, modified-Hamming code, and reed-Solomon code. The predetermined number of error bits may be determined depending on the error correcting code.

In generating the word line voltage, bad sector data request signal is generated based on the updated bad sector information. The word line voltage is generated in response to the bad sector data request signal. For example, when all of the plurality of sectors are determined as a normal sector, the bad sector data request signal may be disabled. The normal sector respectively includes error bits of a number that is less than or equal to a predetermined number of error bits. Whereas, when one or more of the plurality of sectors are determined as the bad sector again, the bad sector data request signal may be enabled.

In an initial condition, the bad sector information may be set to indicate that the plurality of the sectors is the bad sector, and thus the bad sector data may be substantially the same as the read data.

In some example embodiments, the non-volatile memory device may be a NAND flash memory device of a multi level cell (MLC) type.

The method of reading data in the non-volatile memory device, according to some example embodiments, transfers the bad sector data instead of the read data with respect to each read cycle to reduce the read operation.

BRIEF DESCRIPTION OF THE DRAWINGS

Illustrative, non-limiting example embodiments will be more clearly understood from the following detailed description taken in conjunction with the accompanying drawings.

FIG. 4 is a conceptual diagram illustrating one possible example of a read operation as it relates to read data, bad sector data, bad sector information, and the bad sector data request signal for consecutive read cycles within the read operation.

DESCRIPTION OF THE EMBODIMENTS

Figure 1:
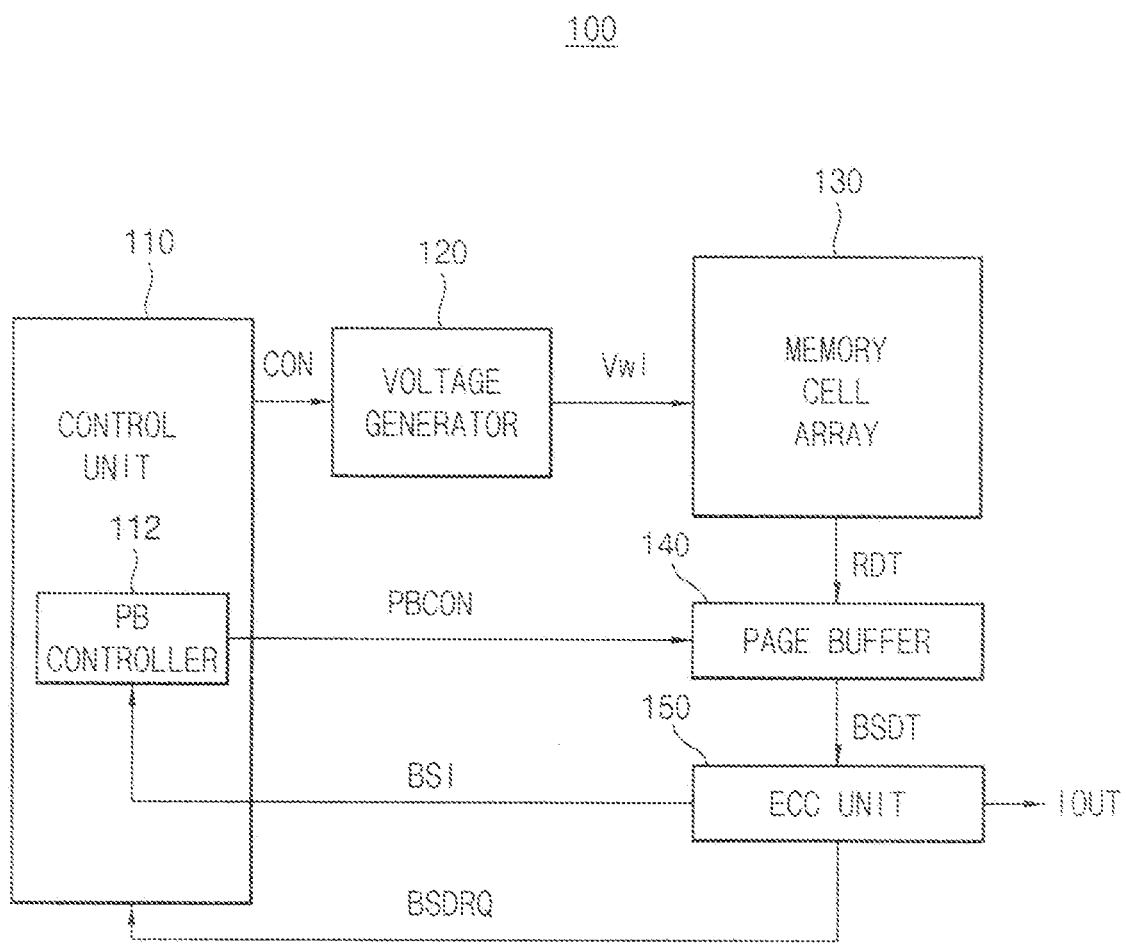
FIG. 1 is a block diagram illustrating a non-volatile semiconductor memory device according to certain embodiments of the inventive concept.

Embodiments of the inventive concept now will now be described in some additional detail with reference to the accompanying drawings. The present inventive concept may, however, be embodied in many different forms and should not be construed as being limited to only the illustrated embodiments. Rather, these embodiments are presented as teaching examples. Throughout the drawings and written description, like reference numbers and labels are used to denote like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a non-volatile semiconductor memory device according to certain embodiments of the inventive concept.

Referring to FIG. 1, a non-volatile semiconductor memory device 100 comprises a control unit 110, a voltage generator 120, a memory cell array 130 including a plurality of memory cells, a page buffer 140, and an error detection and/or correction (ECC) unit 150.

The non-volatile semiconductor memory device 100 may include an electrically erasable programmable read only memory (EEPROM), a flash memory, a phase change random access memory (PRAM), a magnetic random access memory (MRAM), a ferroelectric random access memory (FRAM) and so on. For example, the non-volatile semiconductor memory device 100 may be a NAND flash memory device of a single level cell (SLC) type or a NAND flash memory device of a multi level cell (MLC) type.

The control unit 110 may include a page buffer controller 112. The page buffer controller 112 receives bad sector information BSI from the ECC unit 150 to generate a page buffer control signal PBCON controlling a transfer of bad sector data BSDT. Although the page buffer controller 112 is illustrated as included in the control unit 110 in FIG. 1, the page buffer controller 112 may be implemented as an element separate from the control unit 110.

The voltage generator 120 receives a control signal CON from the control unit 110 and generates a word line voltage Vwl. During a read operation, the voltage generator 120 may generate a read voltage Vread and a pass voltage Vpass. The read voltage Vread correspond to a voltage which is applied to a selected word line and the pass voltage Vpass may correspond to a voltage which is applied to unselected word lines. The voltage generator 120 may adjust at least one of the read voltage Vread and the pass voltage Vpass based on the control signal CON.

Data stored in each of memory cells may be determined based on the word line voltage Vwl applied to the selected word line and the threshold voltage of the memory cell coupled to the selected word line. For example, in the NAND flash memory device of the SLC type, a single read voltage Vread is applied to the memory cells to determine data stored in a selected word line, the memory cells having a threshold voltage less than the single read voltage Vread are turned ON and the memory cells having a threshold voltage greater than the single read voltage Vread are turned OFF, and thus the data may be determined as "1" or "0".

In the NAND flash memory device of the MLC type, data stored in the memory cell may be determined based on a plurality of read voltages Vread and the threshold voltages. As program and erase operations are repeatedly performed, a distribution of threshold voltages of the memory cells becomes wider, error bits included in the read data increases, and thus time for detecting and correcting the error bits increases. The read voltage Vread should be precisely controlled, and thus the overall operation time may increase.

Based on the word line voltage Vwl, read data RDT is detected through bit lines of the memory cell array 130. The read data RDT may include data read from a plurality of sectors included in a desired block. The desired block may be determined based on addresses provided from an address buffer (not shown). The read data RDT may include data read from the desired block regardless of whether the plurality of sectors includes a bad sector or not.

The read operation may include a plurality of read cycles with respect to the word line voltage Vwl such as the read voltage Vread. The read cycles may be repeatedly performed until all of the plurality of sectors are determined as a normal sector. The read operation may be terminated after performing an error correcting operation on data of the normal sector. The read data RDT may be updated with the repeated read cycles, and the plurality of sectors may be differently determined as the bad sector or the normal sector for each read cycle.

The page buffer 140 receives the read data RDT, and transfers the bad sector data BSDT to the ECC unit 150 based on the page buffer control signal PBCON. The bad sector data BSDT may correspond to data read from at least one bad sector. The bad sector may be determined by the ECC unit 150 based on bad sector data BSDT and an error correcting code. Thus, the bad sector data BSDT may include data of the bad sector which is determined in a previous read cycle. The plurality of sectors may include the at least one bad sector and normal sectors. The page buffer 140 transfers the bad sector data BSDT excepting the normal sector data from the read data RDT based on the page buffer control signal PBCON.

The page buffer 140 may operate as a write driver providing writing data to the memory cell array 130 during a program operation and operate as a sense amplifier detecting the read data RDT from the memory cell array 130 during the read operation. The page buffer 140 may be implemented with a plurality of page buffer circuits respectively coupled to the bit lines. The bad sector data BSDT may become smaller as the read cycle is repeatedly performed.

The non-volatile memory device 100 according to certain embodiments transfers the bad sector data BSDT to the ECC unit 150 instead of the read data RDT. Because a size of the bad sector data BSDT is less than that of the read data RDT, the bad sector data BSDT may be transferred to the ECC unit 150 faster and time for checking error bits may be reduced.

The ECC unit 150 receives the bad sector data BSDT, checks the error bits of the bad sector data BSDT, determines whether the bad sector is failed or not based on the number of error bits for each bad sector, and updates the bad sector information BSI.

When the bad sector includes error bits, the number of which is greater than the predetermined number of error bits, the bad sector is determined as the bad sector again. Whereas, the bad sector including error bits of a number that is less than or equal to the predetermined number of error bits, the bad sector is determined as the normal sector. The bad sector determined in the previous read cycle may be determined as the normal sector or the bad sector in the present read cycle.

Based on the determination result, bad sector information BSI is updated. The bad sector information BSI may include bad sector addresses indicating addresses of the memory cells determined as the bad sector during the present read cycle. The ECC unit 150 provides the updated bad sector information BSI to the page buffer controller 112 to generate the page buffer control signal PBCON. The page buffer 140 transfers bad sector data BSDT based on the page buffer control signal PBCON.

When at least one bad sector is determined as the bad sector again, the ECC unit 150 enables a bad sector data request signal BSDRQ. The control unit 110 generates the control signal to perform the next read cycle in response to the bad sector data request signal BSDRQ. When all of the plurality of the sectors are determined as the normal sector, the bad sector data request signal BSDRQ is disabled, and then the read operation is terminated. The read operation may be terminated after the normal sector data is corrected by using the error correcting code. The corrected normal sector data may be merged and output as output data IOUT.

Figure 2:
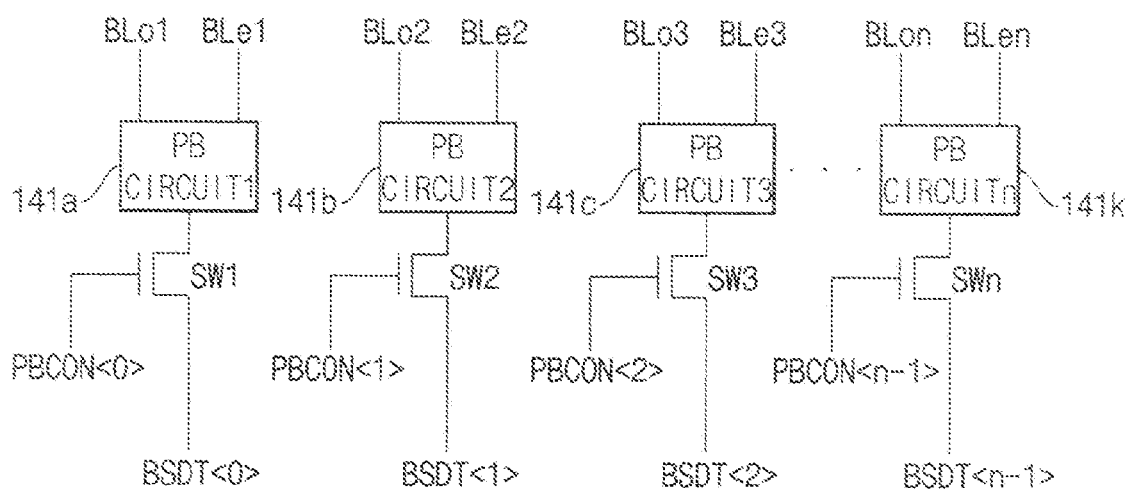
FIG. 2 is a circuit diagram further illustrating in one example the page buffer in the non-volatile memory device of FIG. 1.

FIG. 2 is a circuit diagram illustrating an example of the page buffer in the non-volatile memory device of FIG. 1.

Referring to FIG. 2, the page buffer 140 may include a plurality of page buffer circuits 141a, 141b, 141c, ..., and 141k, a plurality of switches SW1, SW2, SW3, ..., and SWn.

The plurality of page buffer circuits 141a, 141b, 141c, ..., and 141k may be respectively connected between corresponding bit line pair of the memory cell array 130 in FIG. 1 and a first terminal of the plurality of switches SW1, SW2, SW3, ..., and SWn.

Each of the page buffer circuits 141a, 141b, 141c, ..., and 141k detects data from the corresponding memory cell and stores the detected data bit. The plurality of page buffer circuits 141a, 141b, 141c, ..., and 141k may receive additional bit line selection signal to select an even bit line or an odd bit line.

The plurality of switches SW1, SW2, SW3, ..., and SWn is connected between the plurality of the page buffer circuits 141a, 141b, 141c, ..., and 141k and the ECC unit 150 in FIG. 1.

The plurality of switches SW1, SW2, SW3, ..., and SWn provides each bit of the read data RDT to the ECC unit 150 in response to each bit of the page buffer control signal PBCON<0>, PBCON<1>, PBCON<2>, ..., and PBCON<n-1>. The page buffer control signal PBCON<0>, PBCON<1>, PBCON<2>, ..., and PBCON<n--1> selectively turns on/off the plurality of switches SW1, SW2, SW3, ..., and SWn based on whether the corresponding sector is determined as the bad sector in the previous read cycle. Therefore, the page buffer 140 exclusively transfers data bits corresponding to the bad sector as the bad sector data BSDT<0>, BSDT<1>, BSDT<2>, ..., BSDT<n-1> to the ECC unit 150.

Figure 3:
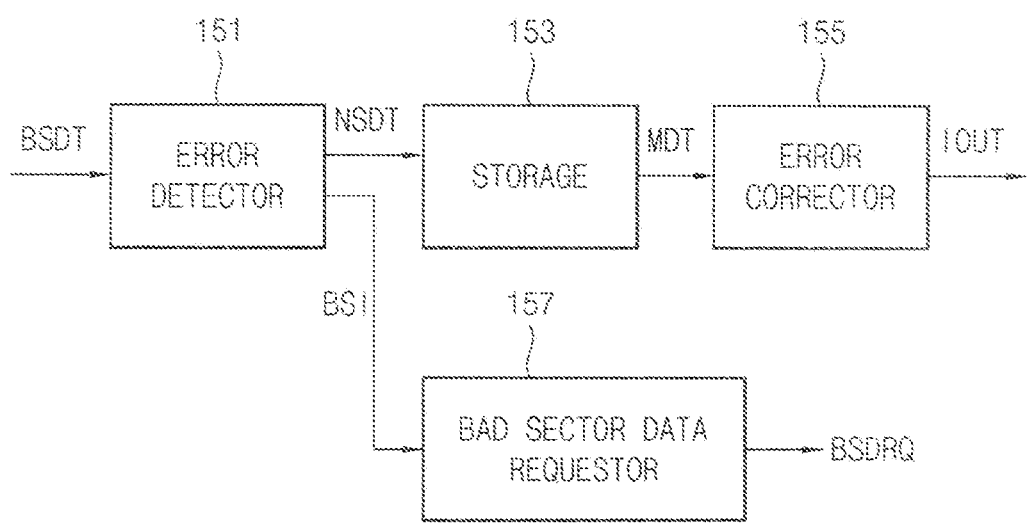
FIG. 3 is a block diagram further illustrating in one example the error detection/correction unit in the non-volatile memory device of FIG. 1.

FIG. 3 is a block diagram illustrating one possible example of an error correction/detection (ECC) unit that may be incorporated within the non-volatile memory device of FIG. 1.

Referring to FIG. 3, the ECC unit 150 may include an error detector 151, a storage device 153, an error corrector 155, and a bad sector data requestor 157.

The error detector 151 checks error bits of the bad sector data BSDT to update the bad sector information BSI. In an initial condition, the bad sector information BSI is set to indicate that the plurality of the sectors corresponds to the bad sector. The error detector 151 determines the bad sector as the normal sector when the bad sector includes the error bits of a number that is less than or equal to the predetermined number of error bits. Whereas, the error detector 151 determines the bad sector as the bad sector again when the bad sector includes the error bits, the number of which is greater than the predetermined number of error bits. The predetermined number of the error bits may correspond to a maximum number of error bits which may be correctable by using the error correcting code. Based on the number of the error bits for each sectors, the bad sector in the previous read cycle may be determined as the normal sector in the present read cycle. Because the data of newly determined normal sector may be corrected by using the error correcting code, the error detector 151 may provide the data of the normal sector to the storage device 153. The data of the normal sector may be referred to as the normal sector data NSDT.

The storage device 153 stores the normal sector data NSDT. The normal sector data NSDT may be stored with respect to each read cycle, and thus the storage device 153 merges the normal sector data NSDT for each read cycle to generate a merged sector data MDT. The merged sector data MDT may include data from the plurality of the sectors.

The error corrector 155 receives the merged sector data MDT, corrects the error bits of the merged sector data MDT using the error correcting code, and then outputs the error corrected sector data as the output data IOUT. The error correcting code may be used to detect and correct error bits during the read and writing operations. The error correcting codes may include a Hamming code, a modified-Hamming code, and a reed-Solomon code. The normal sector data NSDT may be corrected by using the error correcting codes and doesn't required to be checked again by the error detector 151.

When the bad sector information BSI indicates that one or more sectors are determined as the bad sector, the bad sector data requestor 157 enables the bad sector data request signal BSDRQ. The control unit 110 performs next read cycle in response to the enabled bad sector data request signal BSDRQ.

When the bad sector information BSI indicates that all of the plurality of the sectors are determined as the normal sector, the bad sector data requestor 157 disables the bad sector data request signal BSDRQ. The control unit 110 terminates the read operation in response to the disabled bad sector data request signal BSDRQ. For example, the error corrector 155 may perform error correcting operation on the merged sector data MDT in response to the disabled bad sector data request signal BSDRQ.

FIG. 4 is a conceptual diagram illustrating one possible read operation including read data, bad sector data, bad sector information, normal sector data and the bad sector data request signal for consecutive read cycles of the read operation. The exemplary read operation of FIG. 4 assumes, as an example, first, second and third read cycles.

When a desired block includes five sectors SECTOR1, SECTOR2, SECTOR3, SECTOR4 and SECTOR5, the read data RDT read from the five sectors of the memory cell array 130 may be provided to the page buffer 140. In initial condition, the bad sector information BSI is set to indicate that all of the five sectors correspond to the bad sector, and thus the bad sector data BSDT which is substantially the same as the read data RDT is transferred to the ECC unit 150.

The bad sector information BSI is updated by checking the error bits of the bad sector data BSDT. For example, it may be assumed that the predetermined number of error bits corresponds to "4". When error bits respectively included in data of first and fourth sectors SD1 and SD4 is less than or equal to "4", the first and fourth sectors are determined as the normal sector. Whereas, data of second, third and fifth sectors SD2, SD3 and SD5 respectively includes the error bits the number of which is greater than "4", the second, third and fifth sectors are determined as the bad sector again.

In the first read cycle, the normal sector NSDT data may correspond to data of the first and fourth sectors SD1 and SD4 so that data of the first and fourth sectors SD1 and SD4 may be stored in the storage device 153. The bad sector information BSI is updated such that the second, third and fifth sectors correspond to the bad sector. Because at least one bad sector remains, the bad sector data request signal BSDRQ is enabled.

The read data RDT in the second read cycle may be different from the read data RDT in the first read cycle because the word line voltage is varied based on the bad sector information. Based on the updated bad sector information, page buffer 140 transfers bad sector data BSDT corresponding to data of the second, third and fifth sectors SD2', SD3' and SD5', which is determined as the bad sector in the first read cycle. The ECC unit 150 checks the error bits of the bad sector data BSDT and determines the second and third sectors as the normal sector. Compared with the first read cycle, size of the bad sector data BSDT to be transferred is reduced, and thus time for transfer and error checking may be reduced. The normal sector data NSDT of the second read cycle may include data of the second and fifth sectors SD2' and SD5'. The storage device 153 may receive and store the data of the second and fifth sectors SD2' and SD5', and then the data of the first and fourth sectors SD1 and SD4 stored in the first read cycle may be merged with the data of the second and fifth sectors SD2' and SD5'.

Since the third sector is determined as the bad sector in the second read cycle, the bad sector data request signal BSDRQ is enabled to perform the third read cycle.

In the third read cycle, the page buffer 140 transfers data of the third sector SD3" as the bad sector data BSDT excepting data of the first, second, fourth and fifth sectors SD1", SD2", SD4" and SD5" from the read data RDT. The ECC unit 150 checks error bits of the bad sector data BSDT which may correspond to the data of the third sector SD3", and determines the third sector as the normal sector when the data of the third sector SD3" includes the error bits of a number that is less than or equal to the predetermined number of error bits.

The data of the third sector SD3" is provided to the storage device 153 as the normal sector data NSDT. Because all of the five sectors are determined as the normal sector, the bad sector data request signal BSDRQ is disabled. When the bad sector data request signal BSDRQ is disabled, the storage device 153 may merge the sequentially stored normal sector data NSDT to generate the merged sector data MDT. The error corrector 155 receives the merged sector data MDT, corrects the error bits, and outputs the corrected merge sector data as the output data IOUT.

Figure 5:
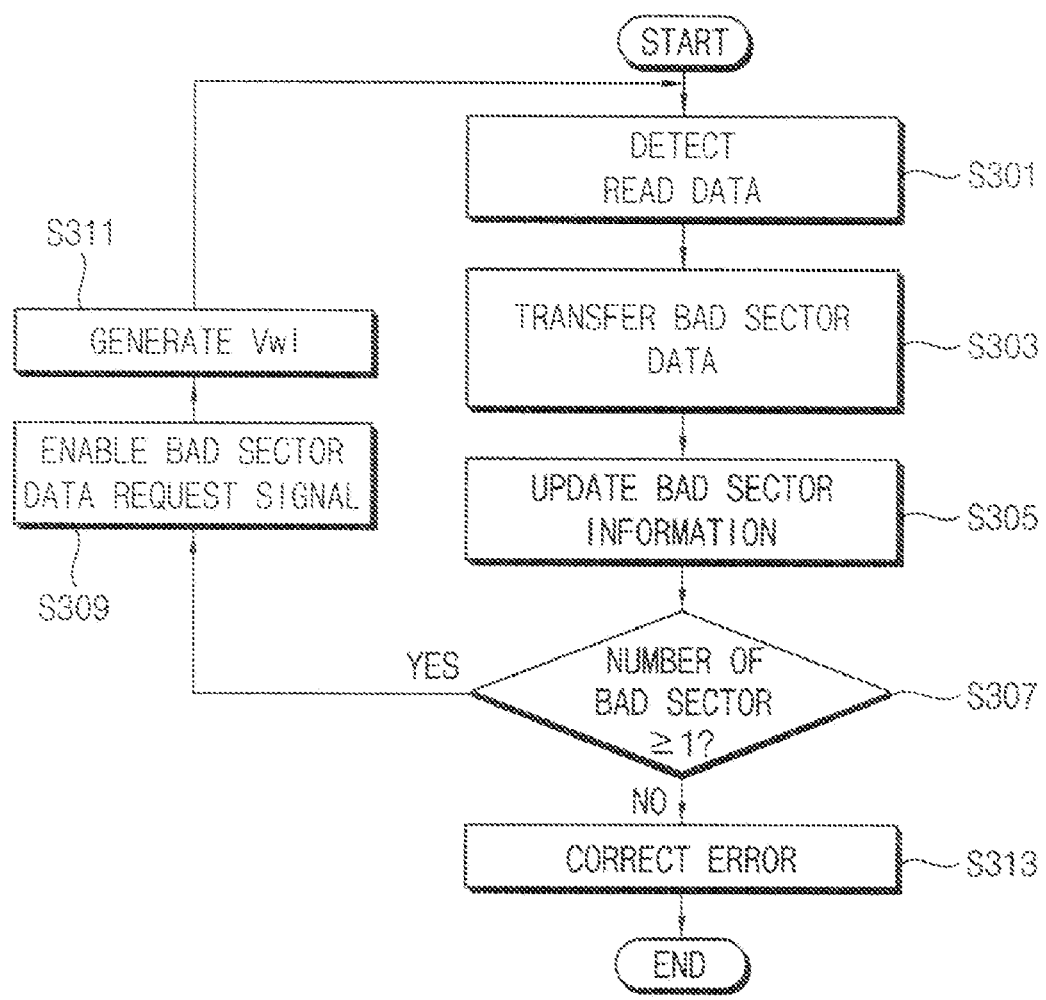
FIG. 5 is a flow chart summarizing a method of reading data from a non-volatile memory device according to certain embodiments of the inventive concept.

FIG. 5 is a flow chart summarizing a method of reading data from a non-volatile memory device according to certain embodiments. The exemplary method of reading data will be described with reference to FIGS. 1 through 5.

The read data RDT is first detected by applying the word line voltage Vwl to the memory cell array 120 (S301). The read data RDT may include data read from the plurality of the sectors included in the desired block, and thus the read data RDT may include data on a sector basis. The desired block may be determined by an addresses provided from the address buffer. The read data RDT may include data of the bad sector, that is the bad sector data BSDT, and data of the normal sector.

The page buffer 140 transfers the bad sector data BSDT included in the read data RDT based on the page buffer control signal PBCON (S303). As mentioned above, the page buffer control signal PBCON is generated based on the bad sector information BSI for identifying the bad sectors among the plurality of sectors. The page buffer 140 selects the bad sector data BSDT from the read data RDT based on the page buffer control signal PBCON, and thus the bad sector data BSDT includes only data of the bad sectors. In the initial condition, all of the plurality of sectors are considered as the bad sector. Therefore, the page buffer 140 transfers the read data RDT as the bad sector data BSDT in the initial condition.

The ECC unit 150 checks the errors bits of the received bad sector data BSDT to determine the bad sector, and updates the bad sector information BSI based on the newly determined bad sector (S305).

The bad sector may be determined when the data of each sector includes the error bits of a number greater than the predetermined error bit number. The predetermined error bit number may be dependent on the error correcting code used for correcting error bits in the error corrector 155. The bad sector information BSI may be generated based on the updated bad sector data BSDT. The bad sector information BSI may include addresses of the bad sectors and the number of error bits with respect to each sector.

When the number of the bad sector is greater than one (S307=YES), that is at least one bad sector remains during the present read cycle, the read data RDT is required to be updated based on the adjusted word line voltage Vwl. Since the error corrector 155 may not sufficiently correct error bits included in the bad sector, the bad sector data request signal BSDRQ is enabled by the bad sector data requestor 157 (S309). The control unit 110 generates the control signal CON in response to the bad sector data request signal BSDRQ. The word line voltage generator 120 generates the word line voltage Vwl based on the control signal CON (S311). The word line voltage Vwl may be adjusted with respect to the read cycle. As mentioned above, distribution of the programmed threshold voltage of memory cells may be varied as write and erase operations are repeated. Thus, the word line voltage Vwl may be adjusted to correctly re-read stored data in the memory cell. The read data RDT may be updated by applying the adjusted word line voltage Vwl to the memory cell array 130. The updated read data RDT may be different from the previous read data RDT since the word line voltage Vwl is adjusted. The page buffer 140 transfers the bad sector data BSDT which excludes the data of the normal sector from the updated read data RDT.

When the number of the bad sector is less than 1, that is all of the plurality of the sectors are determined as the normal sector (S307=No), the error correction operation is performed on the merged sector data MDT (S313). The normal sector data NSDT is repeatedly stored in the storage device 153 with respect to the read cycle. The storage device 153 merges the stored normal sector data NSDT, and finally generates the merged sector data MDT when all of the plurality of the sectors are normal sectors that respectively include correctable errors. After the error correction operation is performed, the read operation is terminated with outputting the error corrected merge sector data as the output data IOUT to an external device.

The non-volatile memory device 100 according to various embodiments may be mounted in a variety of packages. The package may include functional blocks according to the system and/or peripheral devices as well as a flash memory device and a memory controller. For example, the package may include a PoP (Package on Package), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP) and so on.

Figure 6:
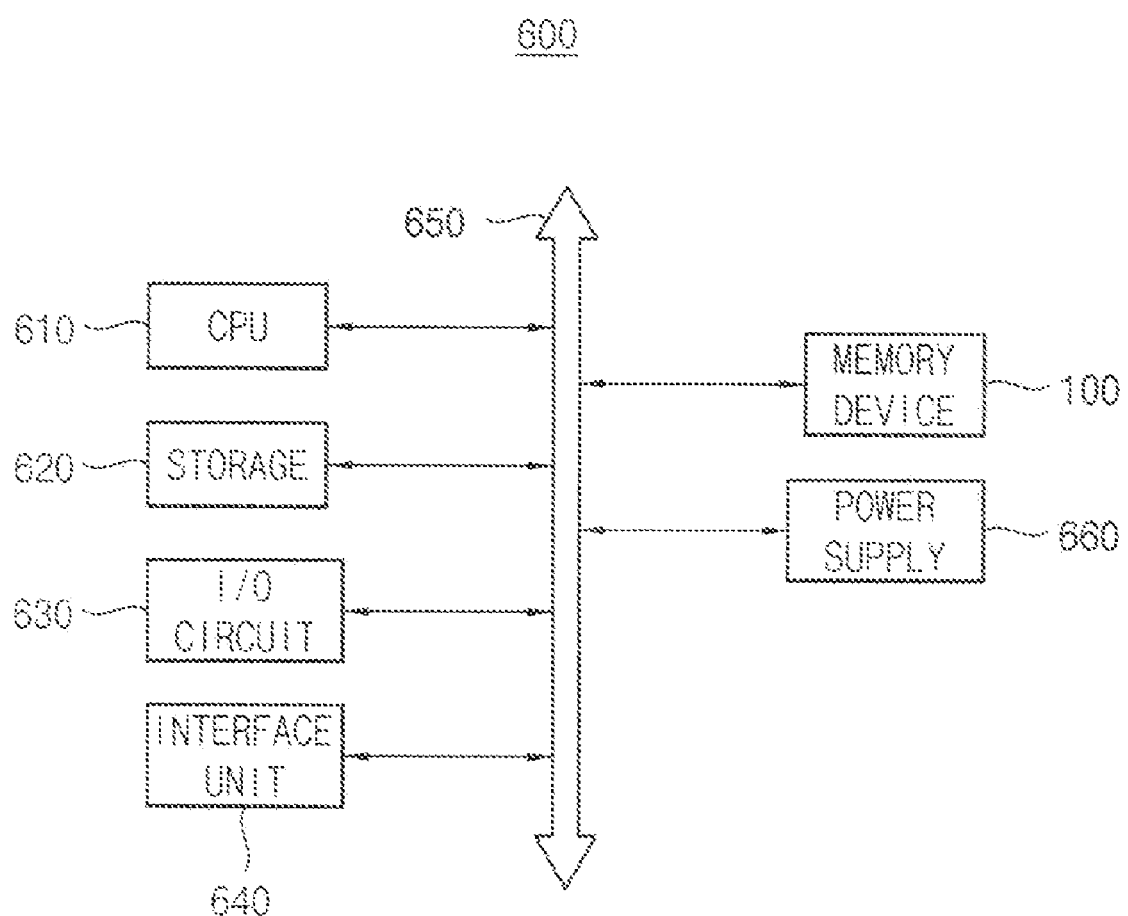
FIG. 6 is a general block diagram of a computational system incorporating a semiconductor memory device according to certain embodiments of the inventive concept.

FIG. 6 illustrates a general computational system incorporating a semiconductor memory device according to certain embodiments of the inventive concept.

Referring to FIG. 6, a computational system 600 comprises a central processing unit 610, a storage device 620, an input/output (I/O) circuit 630, a user interface unit 640, a data bus 650, and the non-volatile memory device 100.

The central processing unit 610 controls overall operations of the computing system 600 through the data bus 650.

The storage device 620 stores data input to the central processing unit 610 and output from central processing unit 610. The storage device 620 may be implemented with the memory device such as a high-speed SRAM.

The I/O circuit 630 inputs and/or outputs signals from/to external devices. The I/O circuit 630 may be key pads, microphones, printers, display devices and so on.

The user interface unit 640 performs an interfacing operation on the signals by converting the signals and providing the converted signals to the data bus 650.

The data bus 650 connects elements included in the computational system 600 to transfer the signals between the elements.

The non-volatile memory device 100 may be implemented as a memory card, or be included in a solid state drive/disk (SSD).

The non-volatile memory device 100 may include the control unit, voltage generator, memory cell array, page buffer, and error correction unit. In each read cycle, the non-volatile memory device 100 transfers the bad sector data, and checks the error bits of the bad sector data instead of the read data. By repeating the read cycle with varying the word line voltage, total time required for performing the read operation including the read cycles may be reduced.

The computational system 600 may further include a power supply 660 for providing operational voltages when the computing system is included in a mobile device such as a cellular phone, a personal data assistant (PDA), a digital camera, an MP3 player and so on. The computational system 600 may further include an application chip set, a camera image processor (CIS), and/or a mobile DRAM (MDRAM) according to example embodiments.

While the example embodiments of the inventive concept and their advantages have been described in detail, it should be understood that various changes, substitutions and alternations may be made without departing from the scope of the inventive concept.

What is claimed is:

1. A method of reading data in a non-volatile memory device, the method comprising:
   detecting read data based on a word line voltage, wherein the read data comprises data read from a plurality of sectors;
   transferring bad sector data based on the read data and bad sector information, wherein the bad sector data corresponds to data read from at least one bad sector within the plurality of sectors;
   updating the bad sector information by checking error bits in the bad sector data; and
   generating the word line voltage based on the updated bad sector information.

2. The method of claim 1, wherein updating the bad sector information comprises:
   if the bad sector includes the error bits of a number less than or equal to a predetermined number of error bits, determining the bad sector as a normal sector.

3. The method of claim 2, further comprising:
   storing normal sector data, wherein the normal sector data corresponds to data read from the normal sector.

4. The method of claim 3, further comprising:
   correcting the error bits included in the normal sector using an error correcting code to generate error corrected sector data.

5. The method of claim 4, wherein the error correcting code includes at least one of Hamming code, modified-Hamming code, and reed-Solomon code.

6. The method of claim 4, wherein the predetermined number of error bits is determined in relation to the error correcting code.

7. The method of claim 1, wherein generating the word line voltage comprises:
   generating a bad sector data request signal based on the updated bad sector information; and
   generating the word line voltage in response to the bad sector data request signal.

8. The method of claim 7, wherein the bad sector data request signal is disabled when all of the plurality of sectors are determined as a normal sector, the normal sector respectively including error bits of a number that is less than or equal to a predetermined number of error bits.

9. The method of claim 1, wherein the bad sector data is substantially the same as the read data in an initial condition.

10. The method of claim 1, wherein the non-volatile memory device is a NAND flash memory device of a multi level cell (MLC) type.

11. A non-volatile memory device, comprising:
    a voltage generator configured to generate a word line voltage;
    a memory cell array configured to store read data, wherein the read data comprises data read from a plurality of sectors;
    a page buffer configured to receive and store read data form the memory cell array;
    an error detection/correction (ECC) unit configured to detect bit errors in the read data stored in the page buffer; and
    a control unit configured to control operation of the voltage generator, memory cell array, page buffer, and ECC unit, such that read data is detected based on the word line voltage, bad sector data is transferred based on the read data and bad sector information, wherein the bad sector data corresponds to data read from at least one bad sector within the plurality of sectors, and the bad sector information is updated by checking error bits in the bad sector data,
    wherein the voltage generator is configured to generate the word line voltage based on the updated bad sector information.

12. The non-volatile memory device of claim 11, wherein the controller is further configured to update the bad sector information by, if the bad sector includes the error bits of a number less than or equal to a predetermined number of error bits, determining the bad sector as a normal sector.

13. The non-volatile memory device of claim 12, wherein the controller is further configured to store normal sector data, wherein the normal sector data corresponds to data read from the normal sector.

14. The non-volatile memory device of claim 13, wherein the ECC unit is further configured to correct error bits included in the normal sector using an error correcting code to generate error corrected sector data.

15. The non-volatile memory device of claim 14, wherein the error correcting code includes at least one of Hamming code, modified-Hamming code, and reed-Solomon code.

16. The non-volatile memory device of claim 14, wherein the predetermined number of error bits is determined in relation to the error correcting code.

17. The non-volatile memory device of claim 11, wherein the controller is further configured to generate a bad sector data request signal based on the updated bad sector information, and the voltage generator is further configured to generate the word line voltage in response to the bad sector data request signal.

18. The non-volatile memory device of claim 17, wherein the bad sector data request signal is disabled when all of the plurality of sectors are determined as a normal sector, the normal sector respectively including error bits of a number that is less than or equal to a predetermined number of error bits.

19. The non-volatile memory device of claim 11, wherein the bad sector data is substantially the same as the read data in an initial condition.

20. The non-volatile memory device of claim 11, wherein the memory cell array comprises a plurality of NAND type, multi level memory cells.

* * * * *